(12) United States Patent
Barth et al.

(10) Patent No.: US 6,451,664 B1
(45) Date of Patent: Sep. 17, 2002

(54) METHOD OF MAKING A MIM CAPACITOR WITH SELF-PASSIVATING PLATES

(75) Inventors: Hans-Joachim Barth, Munich (DE); Gerald Friese; Petra Felsner, both of Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/774,251

(22) Filed: Jan. 30, 2001

(51) Int. Cl.⁷ .................................................. H01L 21/20
(52) U.S. Cl. ........................ 438/396; 438/393; 438/394; 438/250; 438/251; 438/253
(58) Field of Search ................................ 438/250, 251, 438/252, 253, 393, 394, 395, 396

(56) References Cited

U.S. PATENT DOCUMENTS

| | | | |
|---|---|---|---|
| 5,397,729 A | * 3/1995 | Kayanuma et al. | 438/384 |
| 5,547,890 A | * 8/1996 | Tseng | 438/396 |
| 5,731,220 A | * 3/1998 | Tsu et al. | 438/782 |
| 5,741,721 A | * 4/1998 | Stevens | 438/396 |
| 5,851,873 A | * 12/1998 | Murai et al. | 438/253 |
| 5,994,182 A | * 11/1999 | Gonzalez et al. | 438/253 |
| 6,066,892 A | 5/2000 | Ding et al. | 257/751 |
| 6,087,213 A | * 7/2000 | Murai et al. | 438/238 |
| 6,159,790 A | * 12/2000 | Gonzalez et al. | 438/253 |
| 6,197,650 B1 | * 3/2001 | Wu | 438/386 |
| 6,211,545 B1 | * 4/2001 | Gonzalez et al. | 257/306 |
| 6,221,730 B1 | * 4/2001 | Honma | 438/398 |
| 6,238,964 B1 | * 5/2001 | Cho | 438/396 |
| 6,294,420 B1 | * 9/2001 | Tsu et al. | 438/396 |
| 6,372,574 B1 | * 4/2002 | Lane et al. | 438/253 |

OTHER PUBLICATIONS

Ruichen Liu, et al., Single Mask Metal–Insulator–Metal (MIM) Capacitor with Copper Damascene Metallization for Sub–0.18μm Mixed Mode Signal and System–on–a–Chip (SoC) Applications; Proc. IITC(2000), p. 111.

R. Mahnkopf, et al., 'System on a Chip' Technology Platform for 0.18μm Digital, Mixed Signal & eDRAM Applications, IEDM Tech. Digest (1999) p. 849.

* cited by examiner

Primary Examiner—John F. Niebling
Assistant Examiner—Lynn A. Gurley
(74) Attorney, Agent, or Firm—Slater & Matsil, LLP

(57) ABSTRACT

A method of making a metal-insulator-metal (MIM) capacitor (158) having self-passivating plates (143, 155). A liner (116) is deposited on a workpiece (112) and dielectric (114). A conductive layer (142) is deposited and annealed to form dopant-rich region (144). Insulating region (145) is formed on exposed portions of dopant-rich region (144) by exposure to atmosphere or oxygen. Capacitor dielectric layer (146) is disposed over the first capacitive plate (143). A second capacitive plate (155) is formed over the first capacitive plate (143) and capacitor dielectric layer (146). The second capacitive plate (155) is annealed to form dopant-rich region (154) and exposed to atmosphere or oxygen to form insulating region (156). Optional seed layer (140) may be deposited prior to the formation of the first capacitive plate (143).

17 Claims, 3 Drawing Sheets

METHOD OF MAKING A MIM CAPACITOR WITH SELF-PASSIVATING PLATES

TECHNICAL FIELD

The present invention relates generally to the fabrication of semiconductor devices, and more particularly to metal-insulator-metal (MIM) capacitors.

BACKGROUND OF THE INVENTION

Semiconductors are widely used for integrated circuits for electronic applications, including radios, televisions and personal computing devices, as examples. Such integrated circuits typically use multiple transistors fabricated in single crystal silicon. It is common for there to be millions of semiconductor devices on a single semiconductor product. Many integrated circuits now include multiple levels of metallization for interconnections.

For many years, aluminum has been used for the conductive material comprising the interconnect layers of semiconductor devices. Usually an aluminum alloy with a small amount of copper and silicon is used. For example, a prior art aluminum conductive alloy may comprise 2% silicon to prevent the aluminum from diffusing into the surrounding silicon, and 1% copper, to control electromigration and lead breakage due to Joule's heat.

The semiconductor industry continuously strives to decrease the size and increase the speed of the semiconductor devices located on integrated circuits. To accomplish these goals, the semiconductor industry is changing from aluminum to copper for metallization layers. Copper has a lower resistivity compared to the resistivity of aluminum, resulting in faster current capability when used as a conductive material. Also, the use of a lower resistivity metal permits decreased widths and thicknesses. Copper exhibits reduced levels of electromigration as compared with aluminum.

The semiconductor industry is also moving towards using low-dielectric constant (k) materials as insulators between conductive leads and the various metallization layers to reduce the overall size of the semiconductor devices.

Using copper as the material for metallization layers has proven problematic because copper has a tendency to diffuse into and through surrounding dielectric layers, contaminating the semiconductor device and possibly rendering it inoperable. To prevent the copper from diffusing, barrier layers and liners are typically used around copper surfaces to protect the dielectric layers. Metallic barrier layers and/or dielectric cap layers are also required on top of the copper surfaces prior to depositing subsequent dielectric layers. Not only do these barrier layers require additional processing steps and materials, they are particularly problematic in MIM capacitors. The barrier layers used often comprise titanium nitride or some other metal (e.g., Ta, W, and others) combined with a nitride (e.g. TaN, WN and others), and these materials have a higher resistance than copper. Thus, the resistance of the metal plates of a MIM capacitor is increased by the use of the barrier layers. Furthermore, dielectric diffusion barriers or cap layers are required over the top of the copper plates prior to depositing the MIM dielectric.

What is needed in the art is a structure and method for reducing the number of barrier layers and liners required when manufacturing MIM capacitors having copper conductive materials. What is also needed in the art is the ability to have more choices for a MIM capacitor dielectric in order to achieve high area capacitances and high quality standards in the dielectric MIM reliability.

SUMMARY OF THE INVENTION

These problems are generally solved or circumvented by the present invention, which achieves technical advantages as a MIM capacitor having self-passivating plates. The self-passivation prevents copper out-diffusion and/or copper corrosion or oxidation. The self-passivation is achieved by the formation of a dopant-rich surface layer at the interfaces between Cu and the liners or dielectrics and by the formation of a dopant-rich surface layer with a thin insulating (oxidized) top surface layer of the dopant-rich region on Cu surfaces exposed to the environment (e.g. air).

Disclosed is a method of forming a capacitive plate of a MIM capacitor, comprising forming a capacitive plate, and annealing the capacitive plate to form a dopant-rich region at the edges of the capacitive plate. An insulating region is formed over exposed portions of the dopant-rich region.

Also disclosed is a method of fabricating a MIM capacitor, comprising forming a first capacitive plate and annealing the first capacitive plate to form a first dopant-rich region at the edges of the first capacitive plate. A first insulating region is formed over exposed portions of the first dopant-rich region. A capacitor dielectric layer is deposited, and a second capacitive plate is formed. The second capacitive plate is annealed to form a second dopant-rich region at the edges of the second capacitive plate. A second insulating region is formed over exposed portions of the dopant-rich region.

Further disclosed is a metal-insulator-metal (MIM) capacitor, comprising a first capacitive plate having a dopant-rich region at the edges thereof and an insulating region disposed over a portion of the dopant-rich region. A capacitor dielectric layer is disposed over the first capacitive plate, and a second capacitive plate is disposed over the capacitor dielectric layer and the first capacitive plate. The second capacitive plate has a dopant-rich region at the edges thereof and an insulating region disposed over a portion of the dopant-rich region.

Advantages of the invention include a MIM capacitor requiring fewer metal liners and dielectric liners than in the prior art. The surface roughness of the capacitive plate tops is reduced, resulting in a more reliable MIM capacitor. Fewer processing steps and materials are required than in the prior art. The dopant-rich regions are created by annealing, and the oxide regions over the dopant-rich regions are created by exposure to oxygen. The diffusion of copper into capacitor dielectric and other dielectrics in the MIM capacitor is suppressed by the self-passivating metal plates. The self-passivation effect of the copper alloys used protects the copper during capacitor dielectric deposition because of the insulating or oxidized region formed on exposed portions of the dopant-rich region. The conductivity of MIM capacitor metal plates is significantly increased.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Problems with prior art MIM capacitors using copper as the conductive material will be discussed, followed by a description of preferred embodiments of the present invention. Advantages of the preferred embodiment of the invention will then be discussed. Only one MIM capacitor is shown in each figure, although many MIM capacitors and other conductive lines may be present within each layer.

Figure 1:
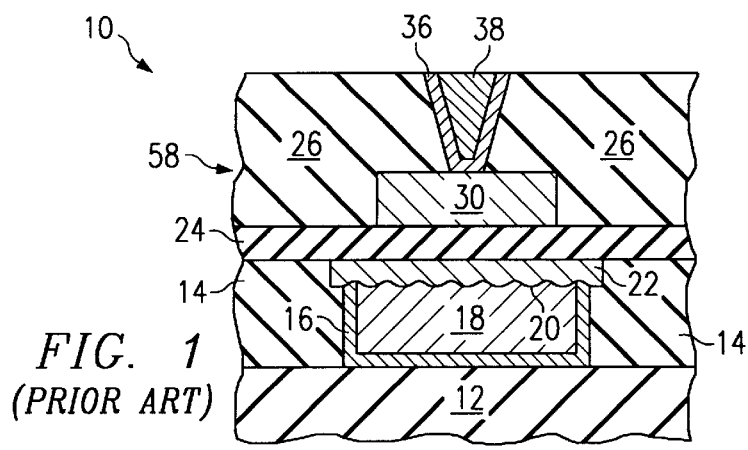
FIG. 1 illustrates a cross-sectional view of a prior art MIM capacitor having a liner beneath the bottom copper plate and a metallic liner on top of the copper plate beneath the MIM capacitor dielectric.

FIG. 1 shows a cross-sectional view of a wafer 10 having a prior art MIM capacitor structure 58 comprising a bottom plate including 16/18, a metallic cap or diffusion barrier layer 22, a capacitor dielectric 24, and a top plate 30. A typical method of fabricating the structure 10 will be described.

A workpiece 12 is provided, typically comprising silicon oxide over single-crystal silicon. The workpiece 12 may include other conductive layers or other semiconductor elements, e.g. transistors, diodes, etc. Compound semiconductors such as GaAs, InP, Si/Ge, SiC may be used in place of silicon.

A first dielectric layer 14 is deposited over the workpiece 12. In the prior art structure described herein, dielectric layer 14 typically comprises silicon dioxide, and may also comprise a low-dielectric constant material, having a dielectric constant k of 3.6 or less, for example. Dielectric layer 14 is patterned and etched.

A liner 16 is deposited over the dielectric layer 14 and exposed portions of workpiece 12. Conductive material 18 comprising bulk copper is deposited over liner 16, and the wafer 10 is annealed. The wafer 10 is exposed to a chemical mechanical polish (CMP) process to remove the liner 16 and copper 18 on dielectric 14.

Bulk copper 18 tends to form hillocks 20 at the top surface as the copper 18 recrystallizes, unless a metallic cap or diffusion barrier 22 is used. Hillocks 20 can deleteriously affect the dielectric breakthrough characteristics and reliability of the MIM capacitor. A diffusion barrier 22 comprising Ta, TaN, TiN, or combinations thereof, for example, is deposited over the copper 18 and exposed portions of dielectric layer 14. The diffusion barrier 22 is patterned and etched to remain only on top of the MIM bottom plate 16/18.

MIM capacitor dielectric 24 is deposited over diffusion barrier 22 and exposed portions of dielectric layer 14. Dielectric 24 typically comprises silicon dioxide.

A metallic material comprising Ti, TiN, Al, W and combinations thereof is deposited and patterned to form top plate 30. Dielectric layer 26 is deposited over top plate 30 and exposed portions of MIM capacitor dielectric 24. Dielectric layer 26 is patterned and etched with a pattern for the vias comprising 36/38. Vias comprising a liner 36 and a conductive fill material 38 are formed in dielectric layer 26 to make electrical contact to the top plate 30 of the MIM capacitor 58. Electrical connection is also made to underlying layers or overlying layers to the bottom plate 16/18 of the MIM capacitor, not shown.

Forming the metallic cap or diffusion barrier 22 requires an additional manufacturing step. The use of a higher resistive (non-copper) material for the top plate deleteriously affects the resistance of the MIM capacitor 58. However, without a diffusion barrier 22, hillocks 20 may form on the top surface of the copper 18 portion of the bottom MIM capacitor plate, which decreases the dielectric breakthrough reliability of the MIM capacitor.

Figure 2:
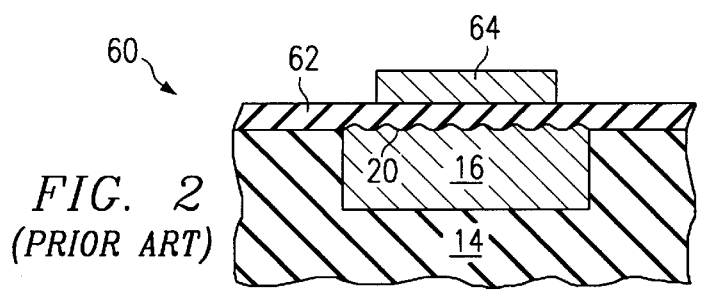
FIG. 2 shows a cross-sectional view of another prior art MIM capacitor having a SiN MIM dielectric layer and a top electrode comprising Ti, TiN, Al and combinations thereof.

Another prior art MIM capacitor disclosed by Liu et al. in IITC Proceedings 2000, pp. 111–113, in an article entitled "Single Mask Metal-Insulator-Metal (MIM) Capacitor with Copper Damascene Metallization for Sub-0.18 $\mu$m Mixed Mode Signal and System-on-a-Chip (SoC) Applications" is shown at 60 in FIG. 2. A damascene copper lower electrode 16 is formed within dielectric layer 14. A PECVD SiN layer 62 is deposited over lower electrode 16 and exposed portions of dielectric layer 14. SiN layer 62 functions as both a MIM capacitor dielectric and also as a diffusion barrier for copper lower electrode 16. A top electrode 64 comprising TiN, AlCu/TiN or Ti/TiN/AlCu/TiN is formed over the SiN layer 62.

There are several problems with the MIM capacitor 62 shown in FIG. 2. The MIM dielectric material is restricted to Cu-diffusion barriers such as SiN. SiN introduces reliability concerns to the MIM capacitor 60 structure, because of charge trapping in the dielectric. An oxide has fewer reliability concerns, for example, and is therefore preferred over a nitride as a MIM capacitor dielectric. Another problem is that the top electrode 64 comprises Ti, TiN, Al and combinations thereof, which materials have a high resistivity than other metals, such as copper. Furthermore, the top surface of the copper bottom electrode 16 is prone to hillock 20 formation during the deposition of SiN 62 and other subsequent layers.

The prior art problems of hillock formation, increased resistance, additional manufacturing steps, decreased dielectric breakthrough reliability and other reliability issues are reduced or alleviated with a preferred embodiment of the present invention, in which copper alloys are used for both electrodes, or plates. The copper alloys are annealed in an inert atmosphere (e.g., vacuum, Ar, $N_2$, forming gas ($N_2$/$H_2$), and others) to provide self-passivation and prevent the requirement of additional liners. The self-passivated plates are exposed to oxygen to form an oxide over the plates.

Figure 3:
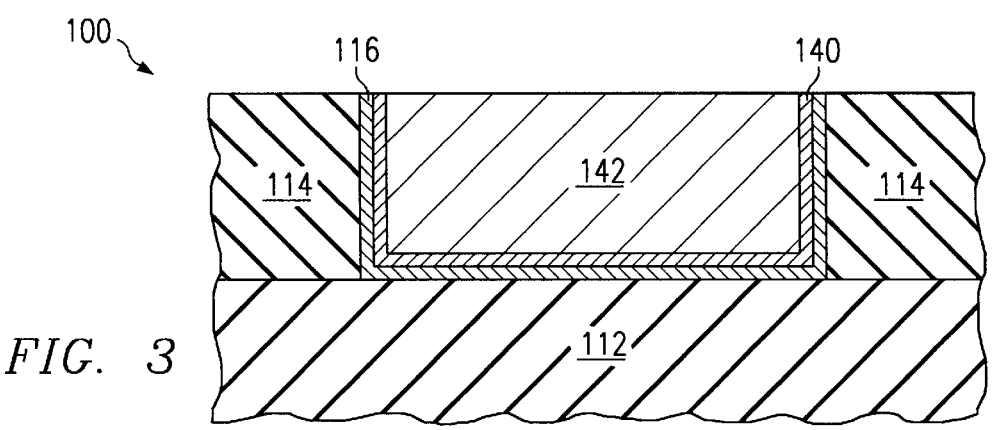
FIGS. 3–9 show cross-sectional views of a MIM capacitor in accordance with a preferred embodiment of the present invention at various stages of fabrication, having self-passivating copper plates and a seed layer on the bottom plate.
Figure 4:
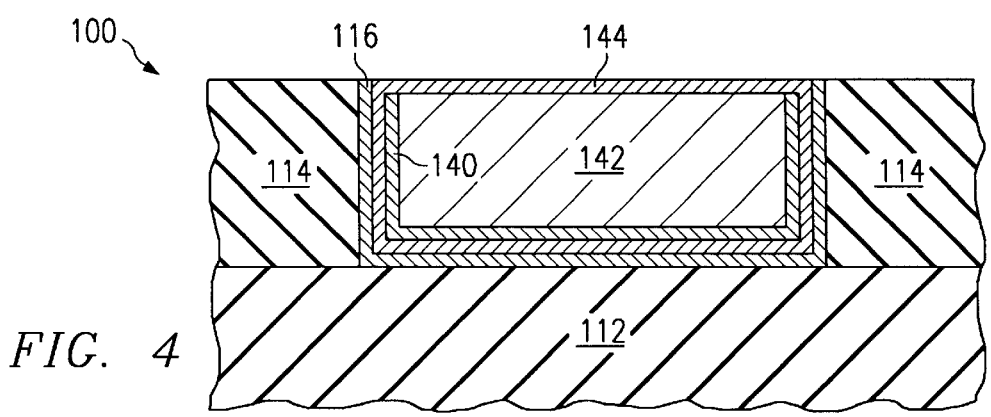

FIGS. 3–9 show cross-sectional views of an embodiment of the present MIM capacitor invention at various manufacturing process stages. Referring first to FIG. 3, shown at 100 is a wafer having a workpiece 112, preferably comprising silicon oxide or any low-K dielectric over, and possibly abutting, single-crystal silicon. The workpiece 112 may include other conductive layers or other semiconductor elements, e.g. transistors, diodes, etc. Compound semiconductors such as GaAs, InP, Si/Ge, SiC may alternatively be used in place of silicon.

A dielectric layer 114 is deposited over the workpiece 112. Dielectric 114 preferably comprises silicon dioxide or a low-dielectric constant material, having a dielectric constant k of 3.6 or less, for example. If a low-k material is used, it is typically spun-on and then exposed to a heating step (baked) of about 400 degrees C. to remove the solvents. Alternatively, the low-k material may be deposited using a CVD process.

Dielectric material 114 is patterned via lithography e.g. with a mask and etched to form areas or trenches where a bottom plate of the MIM capacitor will be formed. The trenches typically are 0.2 to 1 micrometers deep, and are in the shape of a circle, rectangle, or square, for example. The width of the trenches varies with the desired capacitance of the MIM capacitor and typically ranges from 2–3 square micrometers up to a hundred or so microns squared, with the larger the area, the higher the capacitance.

Liner 116 is deposited on dielectric 114 and exposed portions of workpiece 112 by physical vapor deposition (PVD) or chemical vapor deposition (CVD), for example. Liner 116 preferably comprises tantalum nitride, titanium nitride, tungsten nitride, pure tantalum or combinations thereof and alternatively comprises other suitable liner materials that will prevent copper from diffusing through to workpiece 112, for example. Liner 116 is preferably less than 100 nanometers thick, and more preferably around 50 nanometers thick, for example. Liner 116 may also comprise a stack of various materials.

Preferably, an optional seed layer 140 is deposited over the liner 116 by PVD or CVD, for example. Seed layer 140 preferably comprises a copper alloy such as copper combined with magnesium, aluminum, indium or a combination thereof. Preferably, less than 5% of the non-copper material, and more preferably, 1% or less of the non-copper material is mixed with copper. A minimal amount of non-copper material is preferably used to avoid increasing the resistivity excessively. The non-copper material is also referred to herein as a dopant material. Seed layer 140 is preferably less than 200 nanometers thick, and more preferably around 100 nanometers or less, for example.

A conductive layer 142 preferably comprising substantially pure bulk copper is deposited over the seed layer 140, or over the liner 116 when a seed layer 140 is not used. Preferably, conductive layer 142 is deposited by electroplating, to obtain optimal fill in the trench. Although optional, the use of a seed layer 140 is preferred, because the seed layer 140 permits an electroplating wet-line process in which a current is placed on the wafer in a galvanic deposition process. Alternatively, conductive layer 142 may be applied using chemical vapor deposition (CVD).

If seed layer 140 is not used, alternatively, conductive layer 142 preferably comprises a copper alloy such as copper combined with magnesium, aluminum, indium or a combination thereof, for example. Preferably, less than 5% of the non-copper material, and more preferably, 1% or less of the non-copper material is mixed with copper. A CMP process is performed to remove the conductive layer 142, seed layer 140 and liner 116 from the top of dielectric 114, leaving the structure shown in FIG. 3.

The wafer 100 is annealed, preferably in an inert environment (e.g., vacuum, Ar, $N_2$ and forming gas such as $N_2/H_2$, and others) at a temperature in the range of 250 to 400 degrees C. When a seed layer 140 is used, the dopant in the alloy of the seed layer 140 migrates or diffuses through to the outermost seed layer region 140 to reside at the edges and bottom surface of the seed layer region 140, shown as doped region 144 in FIG. 4. During the anneal process, the dopants in the alloy of the seed layer 140 also migrate to the top surface of conductive layer 142, which is included in the pictorial representation of doped region 144. The dopant-rich layer 144 resides at the interface of the seed layer 140 and the liner 116 and along the top surface of the conductive layer 142.

When a seed layer 140 is not used, the dopant in conductive layer 142 alloy migrates or diffuses to the top, bottom and side edges of the conductive layer 142 to form dopant-rich region 144 adjacent the liner 116 and along the top surface of the conductive layer 142.

Figure 5:
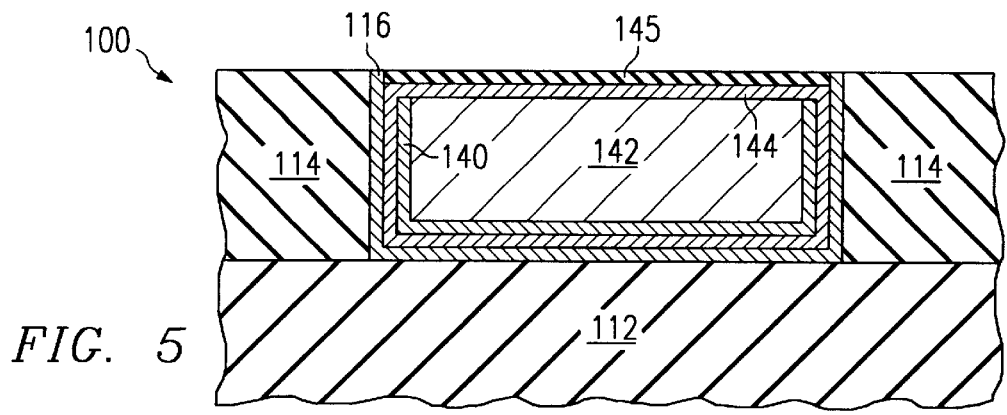

When the wafer 100 is exposed to atmosphere or oxygen, for example, during removal from the processing chamber, an insulating layer comprising a thin layer of native oxide 145 is formed on the top surface of conductive layer 142, as shown in FIG. 5. Oxide 145 comprises the dopant alloy and oxygen, e.g., if copper magnesium is used for seed layer 140, oxide 145 comprises magnesium oxide. Oxide 145 functions as a self-passivation layer on the top of the bottom capacitive plate 143. Bottom plate 143 effectively includes liner 116, optional seed layer 140, dopant-rich region 144 and conductive layer 142.

Figure 6:
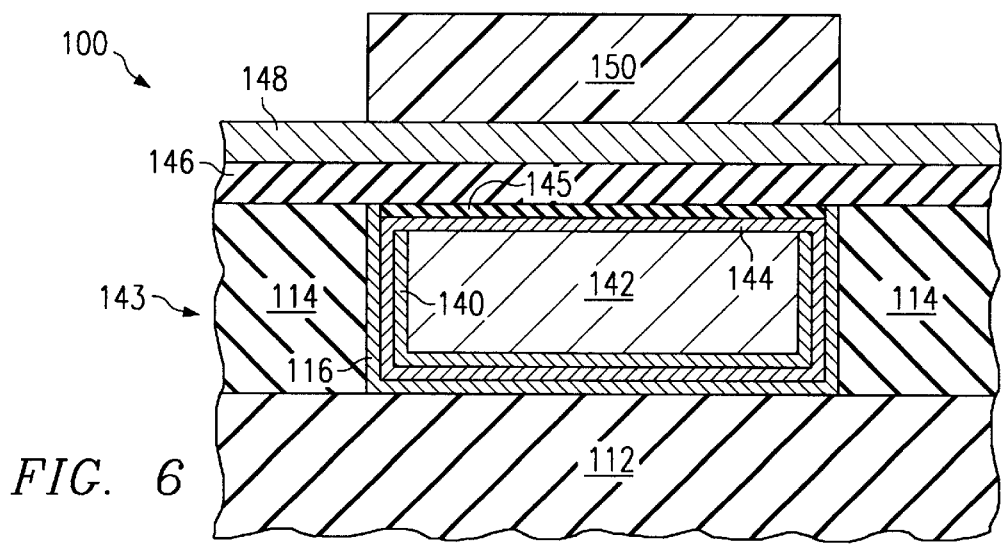

A capacitor dielectric 146 is deposited over dielectric 114 and bottom plate 143, as shown in FIG. 6. Dielectric 146 preferably comprises an insulating material such as silicon dioxide, silicon nitride, combinations thereof, or high dielectric constant materials. Oxide layer 145 permits the use of a capacitor dielectric material 146 that is deposited using an oxidizing agent such as oxygen, e.g. silicon dioxide, because oxide layer 145 acts as a barrier against corroding/oxidizing agents. This is advantageous over prior art MIM capacitors that use SiN and other nitrides as the material for the MIM capacitor dielectric. The use of a copper alloy for either the seed layer 140 or the conductive layer 142 also allows the use of a MIM dielectric 146 that has no barrier properties against copper diffusion because the dopant-rich layer 144 in combination with the oxidized layer 145 suppresses copper diffusion. Furthermore, capacitor dielectric 146 may comprise a high dielectric constant material, which increases the area density of the capacitor.

Next, a conductive material 148 is deposited over capacitor dielectric 146. Conductive material 148 preferably comprises a copper alloy such as copper combined with magnesium, aluminum, indium, or others, or a combination thereof, for example. Preferably, less than 5% of the non-copper material, and more preferably, 1% or less of the non-copper material is mixed with copper.

A photoresist is deposited over conductive material 148. The photoresist is patterned and etched to form a resist mask 150 over conductive material 148 where the top capacitor plate will be formed, shown in FIG. 6.

Figure 7:
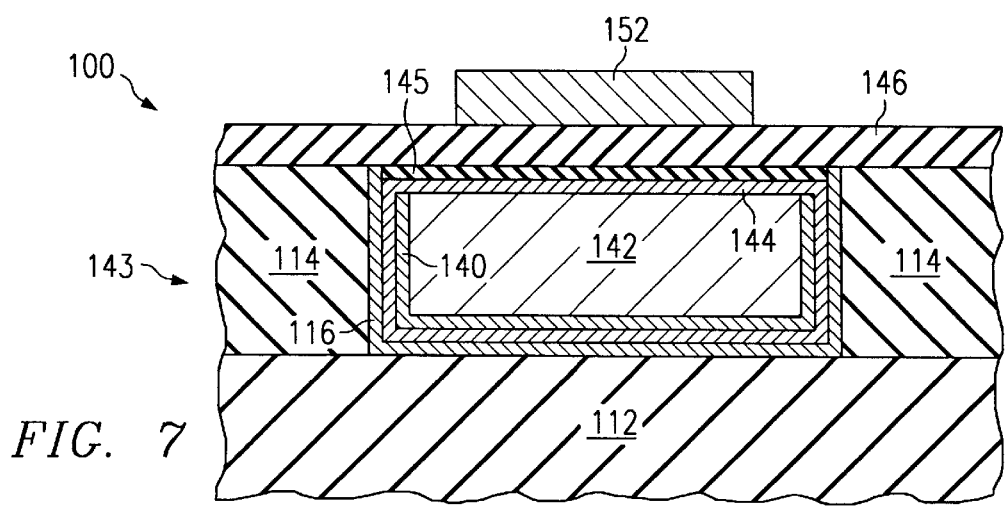

The wafer 100 is exposed to an etch process to form top plate 152 over bottom plate 143 and capacitor dielectric 146, as shown in FIG. 7. Preferably an isotropic etch process is used, although an anisotropic etch may also be used. A wet or dry etch may be used, for example. Top plate 152 may be thinner than bottom plate 143 as shown. In the case of an isotropic etch process, the lateral dimensions of the top plate 152 may be smaller than the original resist pattern 150. In the case of an anisotropic etch process, the top plate dimensions will be identical to the resist mask 150 (not shown).

Figure 8:
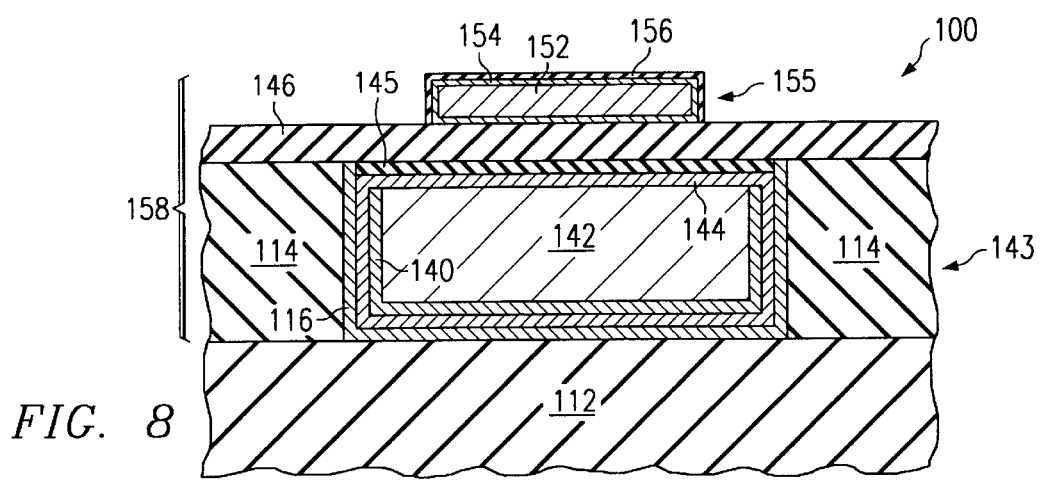

After a resist strip, the wafer 100 is annealed in an inert environment (e.g., vacuum, Ar, $N_2$, forming gas and others) to form a dopant-rich region 154 at the top, bottom and side edges of top plate 152, shown in FIG. 8. Effectively, top capacitive plate 155 includes top plate 152 and dopant-rich region 154. Due to the dopant in the dopant-rich region 154, the adhesion of the copper alloy to dielectric 146 is significantly improved.

The wafer 100 is exposed to atmosphere or oxygen to form an insulating region 156 over the dopant-rich region 154, also shown in FIG. 8. Insulating region 156 comprises an oxide of the dopant in dopant-rich region 154, for example, magnesium oxide or aluminum oxide. The top capacitive plate 155 is self-passivating by the movement of the dopant to the dopant-rich region 154, a top and side portion of which later oxidizes to form insulating region 156. The MIM capacitor 158 includes bottom plate 143, capacitor dielectric 146, and top capacitive plate 155.

Figure 9:
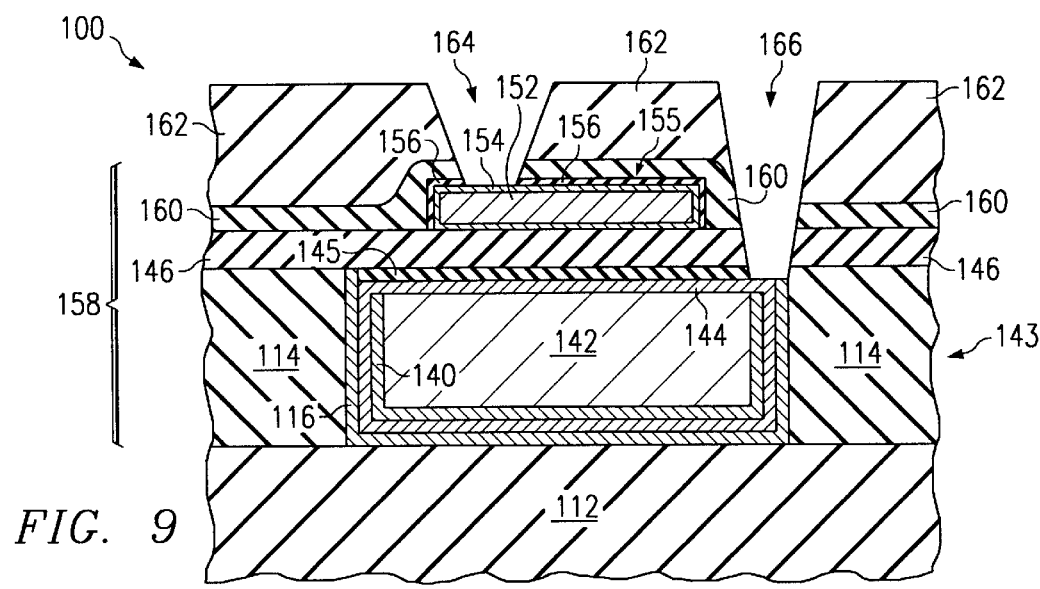

Subsequent processing steps are then performed, as shown in FIG. 9. Dielectric layers 160 and 162 may be deposited over top capacitive plate 155. Dielectric layer 160 may comprise an optional dielectric cap layer comprised of silicon nitride or silicon carbide, for example. However, dielectric layer 160 is not required because of the self-passivating top capacitive plate 155 having an insulating region 156. Dielectric layer 162 preferably comprises silicon dioxide or a low-k dielectric, for example. Other metallization layers may be formed, with vias 164 and 166 being formed to connect upper metallization layers to top capacitive late 155 and bottom plate 143, respectively, as shown. Alternatively, vias may be formed within workpiece 112 to lower metallization layers to connect to bottom plate 143, not shown.

Figure 10:
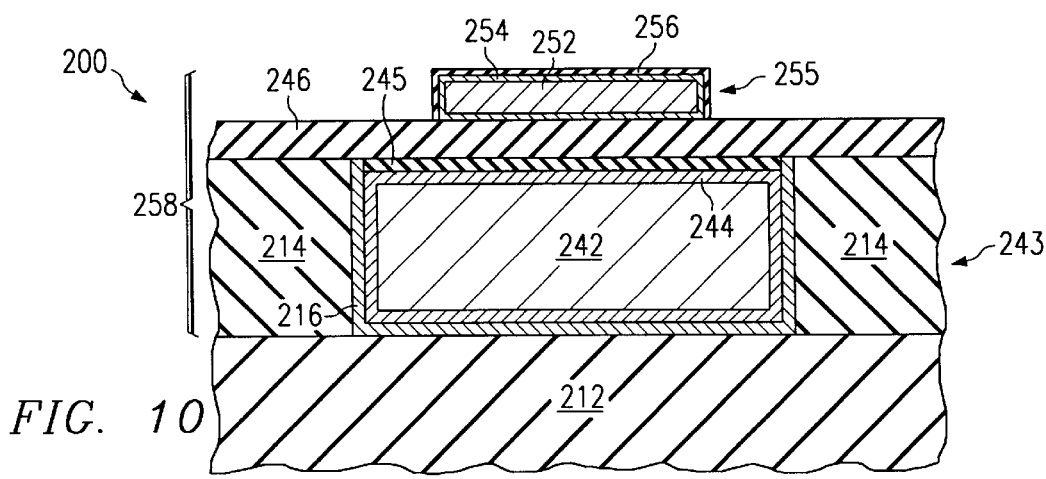
FIG. 10 illustrates another preferred embodiment of the present invention having self-passivating copper plates, without a seed layer on the bottom plate.

FIG. 10 illustrates an alternate embodiment of the resent invention where the conductive material 242 of the bottom plate 243 comprises a copper alloy. No seed layer is used, as in the first embodiment described herein. A workpiece 212 is provided, with the workpiece possibly including lower-level metallization and active layers. A dielectric 214 is deposited over the workpiece 212. Dielectric 214 is patterned and etched to leave regions or trenches where bottom plate 243 will be formed.

A liner 216 is deposited over dielectric 214 and exposed portions of workpiece 212. Liner 216 preferably comprises tantalum nitride, titanium nitride, tungsten nitride, pure tantalum, others, or combinations thereof and alternatively comprises other suitable liner materials that will prevent copper from leeching through to workpiece 212, for example. Liner 216 is preferably less than 100 nanometers thick, and more preferably around 50 nanometers thick, for example. Liner 216 may also comprise a stack of various materials.

The remainder of the trench is filled with a conductive material 242. In this embodiment, the conductive material 242 preferably comprises a copper alloy such as copper combined with magnesium, aluminum, indium or a combination thereof, for example. Preferably, less than 5% of the non-copper material, and more preferably, 1% or less of the non-copper material is mixed with copper.

The wafer 200 is annealed in an inert atmosphere to form a dopant-rich region 244 at the top, bottom, and side edges of the conductive material 242. The wafer 200 is exposed to atmosphere oxygen to form an insulating region 245 on top of dopant-rich region 214. Insulating region 245 comprises an oxide of the dopant in dopant-rich region 244, for example, magnesium oxide or aluminum oxide. Bottom electrode 243 includes liner 216, self-passivating region 244, and conductive material 242.

A capacitor dielectric material 246 is deposited over bottom electrode 243. Dielectric 246 preferably comprises an insulative material such as silicon dioxide, silicon nitride, combinations thereof, or high dielectric constant materials.

A top plate 252 is formed on top of capacitor dielectric material 246. A metal layer is deposited comprising a copper alloy. The top plate 252 metal layer preferably comprises a copper alloy such as copper combined with magnesium, aluminum, indium or a combination thereof, for example. Preferably, less than 5% of the non-copper material, and more preferably, 1% or less of the non-copper material is mixed with copper.

The metal layer is patterned and etched to form a top plate 252. The wafer 200 is annealed in inert atmosphere to cause migration of the dopant alloy to the top, bottom and side edges at dopant-rich region 254 of the top plate 252, with copper alloy 252 remaining in the central region of the top capacitive plate 255. The wafer 200 is exposed to atmosphere or oxygen which forms an insulating region 256 on exposed portions of dopant-rich region 254. The top capacitive plate 255 is self-passivating by the movement of the dopant to the dopant-rich region 254, a portion of which later oxidizes to form insulating region 256.

The novel MIM capacitor and method of fabrication thereof disclosed herein achieves technical advantages as a MIM capacitor 158/258 with self-passivating top 155/255 and bottom 143/243 plates. Fewer metal liners and dielectric liners are required than in prior art MIM capacitors. For example, metallic cap layer 22 of FIG. 1 are not required for the present MIM capacitor 158/258. Rather, dopant-rich regions 144/154/244/254 are created by annealing, and the oxide layers 145/156/245/256 over the dopant-rich regions 144/154/244/254 are created by exposure to oxygen.

Hillock regions 20 in the bottom and top capacitive plates shown in FIG. 1 are reduced or eliminated by the use of the present invention. The use of non-copper materials for the top plate is avoided, resulting in lower resistance of the top plate.

Fewer processing steps and materials are required. Although dopant-rich layers 144/154/244/254 and oxide layers 145/156/245/256 are formed, their formation requires only an annealing step and exposure to oxygen, respectively, rather than the deposition of a material as in the prior art.

The present invention makes use of a characteristic of specific copper alloys, which build up a dopant-rich layer 144/154/244/254 at the outer copper and copper alloy surface, compared to other materials. The dopant-rich layers 144/154/244/254 markedly reduce the interaction of the copper and the interfacing materials, and lead to smoother coverage on dielectric layers and a smoother surface of the copper alloy itself.

The adhesion and wetting behavior of the dopant rich surfaces 144/154/244/254 to dielectrics and metallic liners is significantly improved. Because of the self-passivation effect and the good adhesion of the dopant-rich outer surface it is possible to avoid using a liner 116 underneath the copper alloy seed layer 140. If the optional seed layer 140 is not used, liner 116 can be avoided underneath the copper alloy which is now used as material for creating the bottom plate 142.

The self-passivation effect of the annealed copper alloys 242 and the copper alloy seed layer 140 protects the copper 142/242 during capacitor dielectric 146/246 deposition because of the insulating or oxidized region 145/245. The diffusion of copper into the capacitor dielectric 146/246 is suppressed by the self-passivating metal plate 143/243. The copper 142/242 surface roughness is reduced, leading to a more reliable MIM capacitor 158/258. Copper may be used as top plate 152/252 metallization because the copper alloy has significantly improved adhesion to dielectrics such as capacitor dielectric 146/246 and others deposited in subsequent steps. Furthermore, by using copper alloys for both MIM capacitor plates, the conductivity of MIM capacitor metal plates 143/155/243/255 is significantly increased.

In addition, the present device and method is easily integrated into current manufacturing processes, and benefits from reduced costs. The choice of MIM capacitor dielectric material 146/246 is not limited by copper diffusion, copper oxidation, copper corrosion, or by poor adhesion between a copper plate and MIM dielectric material, or by affecting the copper during the MIM dielectric deposition, as in the prior art.

The MIM capacitor 158/258 described herein may be used in mixed signal and analog applications of integrated circuits, for example. The bottom plate 143/243 may be formed during the formation of leads in a metallization layer of the integrated circuit, for example.

Liner 116 is optional and may not be required in accordance with the present invention, by making optimal use of the self-passivation effect and improved adhesion of the dopant-rich region 144, for example.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, while a single damascene process has been described herein to describe the conductive line formation, a dual damascene or non-damascene process such as a metal etch integration scheme may be used.

In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a capacitive plate of a metal-insulator-metal (MIM) capacitor, comprising:
   forming said capacitive plate of said MIM capacitor, wherein said capacitive plate comprises copper;
   annealing the capacitive plate to form a dopant-rich region at the edges of the capacitive plate, the dopant-rich region being partially exposed; and
   forming an insulating region over the dopant-rich region exposed portions.

2. The method according to claim 1 wherein forming a capacitive plate comprises forming a capacitive plate comprising a copper alloy.

3. The method according to claim 2 wherein forming a copper alloy capacitive plate comprises forming a capacitive plate comprising magnesium, aluminum, indium or a combination thereof.

4. The method according to claim 1 wherein forming an insulating region comprises exposing the dopant-rich region to oxygen or ordinary atmosphere at room temperature.

5. The method according to claim 1 further comprising:
   forming a liner along a portion of the exterior of the capacitive plate.

6. The method according to claim 1 further comprising:
   forming a seed layer along a portion of the exterior of the capacitive plate, wherein the capacitive plate comprises substantially pure copper.

7. The method according to claim 6 wherein the seed layer comprises a copper alloy.

8. The method according to claim 7 further comprising:
   forming a liner along a portion of the exterior of the capacitive plate.

9. A method of fabricating a metal-insulator-metal (MIM) capacitor, comprising:
   forming a first capacitive plate of said MIM capacitor, wherein said first capacitive plate comprises copper;
   annealing the first capacitive plate to form a first dopant-rich region at the edges of the first capacitive plate, the first dopant-rich region being partially exposed;
   forming a first insulating region over the first dopant-rich region exposed portions; and
   depositing a capacitor dielectric layer over the first capacitive plate and first insulating region.

10. The method according to claim 9, further comprising:
    forming a second capacitive plate over the capacitor dielectric layer and the first capacitive plate;
    annealing the second capacitive plate to form a second dopant-rich region at the edges of the second capacitive plate, the second dopant-rich region being partially exposed; and
    forming a second insulating region over the second dopant-rich region exposed portions.

11. The method according to claim 10 wherein forming the first and second capacitive plates comprise forming capacitive plates comprising a copper alloy.

12. The method according to claim 11 wherein forming a copper alloy capacitive plate comprises forming a capacitive plate comprising magnesium, aluminum, indium or a combination thereof.

13. The method according to claim 9 wherein depositing a capacitor dielectric layer comprises depositing an oxide.

14. The method according to claim 9, further comprising:
    forming a liner along a portion of the exterior of the first capacitive plate.

15. The method according to claim 9 further comprising:
    forming a seed layer along a portion of the exterior of the first capacitive plate, wherein the first capacitive plate comprises substantially pure copper.

16. The method according to claim 15 wherein the seed layer comprises a copper alloy.

17. The method according to claim 16 further comprising:
    forming a liner along a portion of the exterior of the capacitive plate.

* * * * *